United States Patent [19]
Hsu et al.

[11] Patent Number: 6,048,740
[45] Date of Patent: Apr. 11, 2000

[54] FERROELECTRIC NONVOLATILE TRANSISTOR AND METHOD OF MAKING SAME

[75] Inventors: Sheng Teng Hsu, Camas; Jer-shen Maa, Vancouver; Fengyang Zhang, Vancouver; Tingkai Li, Vancouver, all of Wash.

[73] Assignee: Sharp Laboratories of America, Inc., Camas, Wash.

[21] Appl. No.: 09/187,238

[22] Filed: Nov. 5, 1998

[51] Int. Cl.[7] .................................................. H01L 29/76
[52] U.S. Cl. .............................. 438/3; 438/369; 438/542; 257/295
[58] Field of Search ..................................... 257/295, 774, 257/315, 340, 346, 748, 750, 297; 438/3, 185, 229, 364, 591, 305, 369, 542

[56] References Cited

U.S. PATENT DOCUMENTS

| | | | |
|---|---|---|---|
| 4,707,897 | 11/1987 | Rohrer et al. | 257/295 |
| 5,177,589 | 1/1993 | Kobayashi et al. | 257/774 |
| 5,293,510 | 3/1994 | Takenaka | 257/295 |
| 5,374,578 | 12/1994 | Patel et al. | 438/3 |
| 5,499,207 | 3/1996 | Miki et al. | 257/295 |
| 5,621,681 | 4/1997 | Moon | 257/295 |
| 5,654,567 | 8/1997 | Numata et al. | 257/295 |
| 5,731,608 | 3/1998 | Hsu et al. | 438/3 |
| 5,926,715 | 7/1999 | Fan et al. | 438/305 |

OTHER PUBLICATIONS

Article entitled, "Preparation of $Bi_4Ti_3O_{12}$ Films by MOCVD and their Application to Memory Devices" by T. Nakamura et al., published in Integrated Ferroelectrics, 1995, pp. 35–46.

Article entitled, "Oriented Lead Germanate Thin Films by Excimer Laser Ablation" by C.J. Peng et al., published in Appl. Phys. Lett. 60(7), Feb. 17, 1992, pp. 827829.

Article entitled, "Study on Ferroelectric Thin Films for Application to NDRO Nonvolatile Memories" by Y. Nakao et al., published in Integrated Ferroelectrics, 1995, vol. 6, pp. 23–34.

Article entitled, "Growth and the Microstructural and Ferroelectric Characterization of Oriented $BaMgF_4$ Thin Films", by Sinhoray et al., published in IEEE Tranactions on Ultrasocics, Ferroelectrics, and Frequency Control., vol. 38, No. 6, pp. 663–669, Nov. 1991 (Best Copy Available).

*Primary Examiner*—Donald L. Monin, Jr.
*Assistant Examiner*—Mike Dietrich
*Attorney, Agent, or Firm*—David C. Ripma; Matthew Rabdau

[57] ABSTRACT

A method of fabricating a ferroelectric memory transistor using a lithographic process having an alignment tolerance of δ, includes preparing a silicon substrate for construction of a ferroelectric gate unit; implanting boron ions to form a p– well in the substrate; isolating plural device areas on the substrate; forming a FE gate stack surround structure; etching the FE gate stack surround structure to form an opening having a width of L1 to expose the substrate in a gate region; depositing oxide to a thickness of between about 10 nm to 40 nm over the exposed substrate; forming a FE gate stack over the gate region, wherein the FE gate stack has a width of L2, wherein $L2 \geq L1+2\delta$; depositing a first insulating layer over the structure; implanting arsenic or phosphorous ions to form a source region and a drain region; annealing the structure; depositing a second insulating layer; and metallizing the structure. A ferroelectric memory transistor includes a silicon substrate having a p– well formed therein; a gate region, a source region and a drain region disposed along the upper surface of said substrate; a FE gate stack surround structure having an opening having a width of L1 located about said gate region; a FE gate stack formed in said FE gate stack surround structure, wherein said FE gate stack has a width of L2, wherein $L2 \geq L1+2\delta$, wherein δ is the alignment tolerance of the lithographic process.

14 Claims, 5 Drawing Sheets

FERROELECTRIC NONVOLATILE TRANSISTOR AND METHOD OF MAKING SAME

FIELD OF THE INVENTION

This invention relates to MOS transistors, and specifically to a MOS memory transistor that incorporates a ferroelectric layer.

BACKGROUND OF THE INVENTION

Prior art single transistor ferroelectric devices may be classified in two types of devices: Metal-Ferroelectric-Metal-Oxide Semiconductor (MFMOS) transistors and Metal-Ferroelectric-Metal-Semiconductor (MFMS) transistors. The structures of such devices are depicted in FIG. 1 and FIG. 2, respectively.

Figure 1:
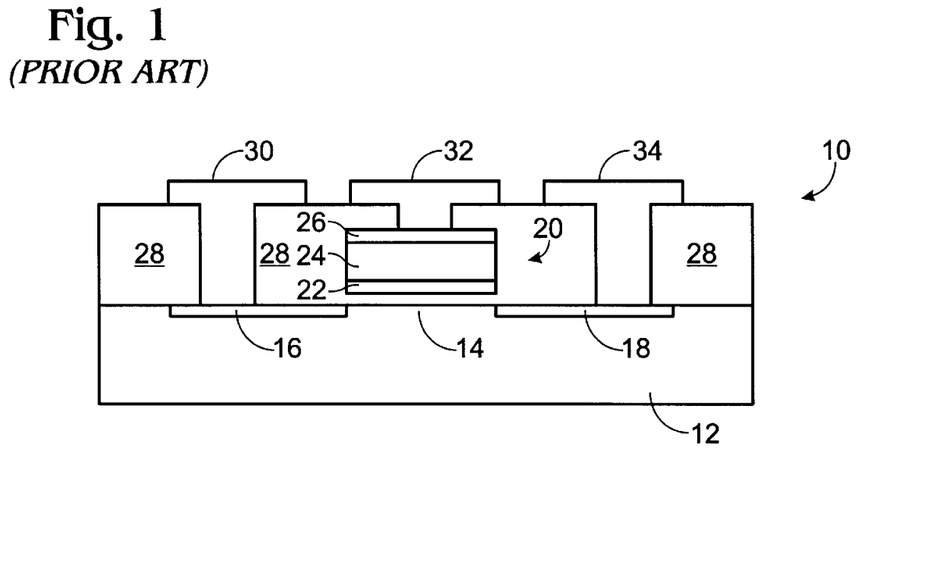
FIG. 1 depicts a prior art MFMOS memory transistor.
Figure 2:
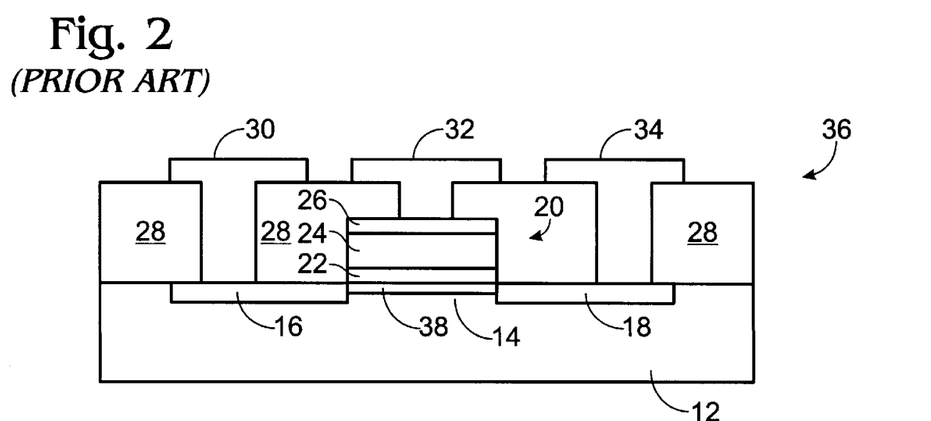
FIG. 2 depicts a prior art MFMS memory transistor.

Referring initially to FIG. 1, a MFMOS memory transistor is depicted generally at 10. Transistor 10 is constructed on a silicon substrate 12. The transistor includes a gate region 14, a n+ source region 16, a n+ drain region 18 and a ferroelectric (FE) gate stack 20. Gate stack 20 includes a bottom electrode 22, a FE layer 24, and a top electrode 26. An oxide insulating layer 28 covers the conductive portions of the transistor. The completed transistor includes a source electrode 30, a gate stack electrode 32, and a drain electrode 34. As shown in FIG. 2, a MFMS memory transistor 36 is similarly constructed to transistor 10, but includes an n- layer 38 in gate region 14.

The materials used in the FE stack for the top and bottom electrode in known ferroelectric memory transistors are Pt, Ir, Zr, IrO, ZrO, or alloys containing one or more of the metals. To insure proper operation of the completed device, the gate stack has to be precisely etched to align the sides of the ferroelectric capacitor. Although equipment is available for performing such etching on the metals, the etch, is at best, a sputtering process, which is only partially successful. It is not possible to selectivity etch the metal without damaging the surrounding silicon oxide and silicon to a degree that is acceptable, which requires that gate stack plasma etching consumes the surrounding silicon and oxide in amounts less than several tens of nanometer. Any consumption greater than this amount will degrade or destroy the normal operation of the memory transistor.

SUMMARY OF THE INVENTION

A method of fabricating a ferroelectric memory transistor using a lithographic process having an alignment tolerance of, includes preparing a silicon substrate for construction of a ferroelectric gate unit; implanting boron ions to form a p- well in the substrate; isolating plural device areas on the substrate; forming a FE gate stack surround structure; etching the FE gate stack surround structure to form an opening having a width of L1 to expose the substrate in a gate region; oxide is deposited by CVD to a thickness of between about 10 nm to 40 nm over the exposed substrate; forming a FE gate stack over the gate region, wherein the FE gate stack has a width of L2, wherein $L2 \geq L1 + 2\delta$; depositing a first insulating layer over the structure; implanting arsenic or phosphorous ions to form a source region and a drain region; annealing the structure; depositing, by CVD, a second insulating layer; and metallizing the structure.

A ferroelectric memory transistor includes a silicon substrate having a p- well formed therein; a gate region, a source region and a drain region disposed along the upper surface of said substrate; a FE gate stack surround structure having an opening having a width of L1 located about said gate region; a FE gate stack formed in said FE gate stack surround structure, wherein said FE gate stack has a width of L2, wherein $L2 \geq L1 + 2\delta$, wherein $\delta$ is the alignment tolerance of the lithographic process.

An object of the invention is to improve the manufacturing yield of ferroelectric memory transistors.

DETAILED DESCRIPTION OF THE PREFERRED EMBODIMENT

Figure 3:
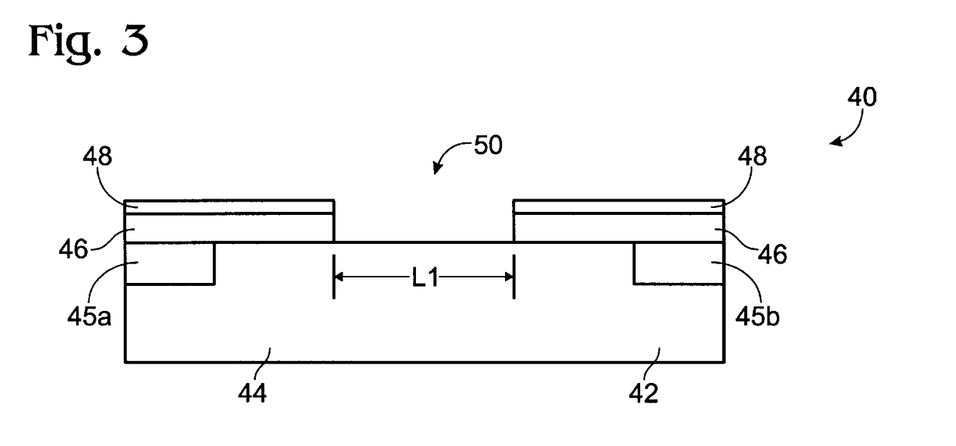
FIGS. 3–5 depict successive steps in the manufacture of a MFMOS memory transistor constructed according to the invention.

Referring now to FIG. 3, the method for fabricating MFMOS memory transistor 40 according to the invention will be described. Plural devices constructed according to the invention are formed on a silicon wafer, which may either a separation by implantation of oxygen (SIMOX) substrate, or a bulk silicon substrate 42. The first step in the manufacturing process is to form the device areas for plural structures by isolating portions of the wafer from adjoining device areas. This may be done by trenching or by implantation of insulating materials.

The next step is n– well or p– well formation in the device areas. In the example provided herein, a p– well 44 is formed in substrate 42 by implantation of boron ions, preferably at an energy level of 30 keV to 180 keV, and a concentration of $5.0 \times 10^{11}$ cm$^{-2}$ to $5.0 \times 10^{13}$ cm$^{-2}$. Oxide regions 45a, 45b are formed in the substrate to provide further device isolation. The threshold voltage is adjusted by implantation of BF$_2$ ions, at an energy level of 10 keV to 50 keV, and a concentration of $1.0 \times 10^{12}$ cm$^{-2}$ to $1.0 \times 10^{13}$ cm$^{-2}$.

Still referring to FIG. 3, a phosphorous silicate glass (PSG) layer 46 is deposited to a thickness of between 100 nm to 300 nm, at a temperature of between 300° C. to 500° C. A silicon oxide cap 48, having a thickness of between 20 nm to 50 nm is deposited over the PSG. The combination of the PSG layer and the silicon oxide cap is referred to herein as a FE gate stack surround structure, for reasons which will become apparent later herein. One technique for depositing the PSG is to introduce PH$_3$ gas into a gas stream during an oxide deposition process. The phosphorous will take the form of phosphorous pentoxide (P$_2$O$_5$), also know as binary glass. The PSG provides an additional moisture barrier between the structure and the substrate, it attracts and hold mobile ionic contaminants, i.e., gettering, to keep the contaminants from migrating to the surface of the structure, and provides increased flow characteristics.

The structure is coated with photoresist, and the PSG at the gate region is plasma etched to form an opening 50 in the FE gate stack surround structure having a width L1. The etching process is stopped before the underlying silicon is removed. The photoresist is then removed, resulting in the structure as shown in FIG. 3.

A layer of low-temperature oxide 52 is deposited by CVD to a thickness of between 10 nm to 40 nm. This layer is plasma etched to the level of the silicon substrate. The structure is wet cleaned, and the silicon is etched just enough to remove any silicon damaged during the plasma etch process.

The exposed gate region is oxidized by exposure to an oxygen atmosphere during heating to a temperature of between 700° C. to 900° C. Two portions of PSG layer 46 and oxide cap 48 remain on substrate 42. Oxide layers 52 and the remaining portions of oxide cap 48 merge into a single oxide layer 52.

Figure 4:
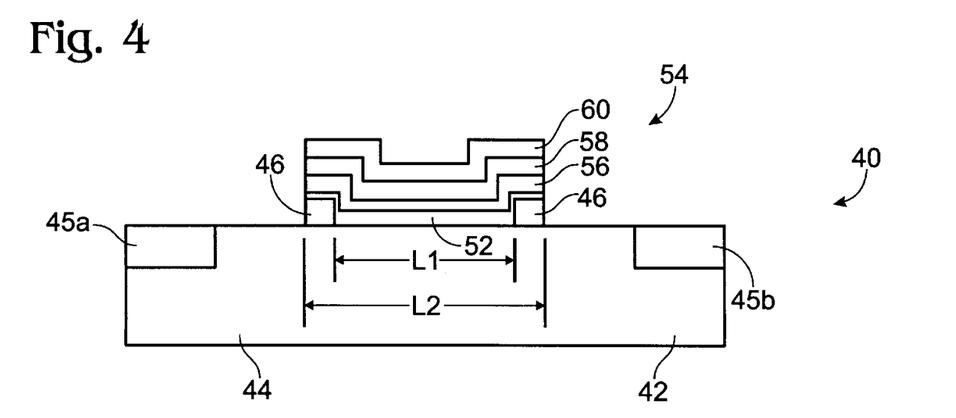

At this point, formation of the ferroelectric gate unit may begin. Referring now to FIG. 4, a FE gate stack is identified generally at 54, and includes a bottom electrode 56, the ferroelectric (FE) material 58 and a top electrode 60. The construction of FE gate stack 54 begins with the deposition of the bottom electrode on oxide layer 52. Bottom electrode 56 may be formed of Pt or Ir, an alloy of Pt/Ir, or other suitable conductive material. The thickness of this metal is 20 nm to 100 nm.

Next, FE material 58 is deposited by chemical vapor deposition (CVD). The FE material may be any of the following: $Pb(Zr, Ti)O_3$ (PZT), PLZT, $SrBi_2Ta_2O_9$ (SBT), $Pb_5Ge_3O_{11}$, $BaTiO_3$, or $LiNbO_3$. The preferred compounds are, in order of preference, $Pb_5Ge_3O_{11}$, SBT and PZT. Most of the experimental work in the FE gate unit field has been done on PZT compounds. FE material 58 is deposited to a thickness of 100 nm to 400 nm.

The top electrode 60 is then formed over the FE material. The top electrode may be formed of the same materials as the bottom electrode, to a thickness of 20 nm to 200 nm.

The structure is coated with photoresist. Ferroelectric gate stack 54, along with underlying PSG 46 and oxide 52, is plasma etched, to the level of silicon substrate 42. The width of the ferroelectric stack is L2, where $L2 \geq L1+2\delta$, and $\delta$ is the alignment tolerance of the lithographic process.

Figure 5:
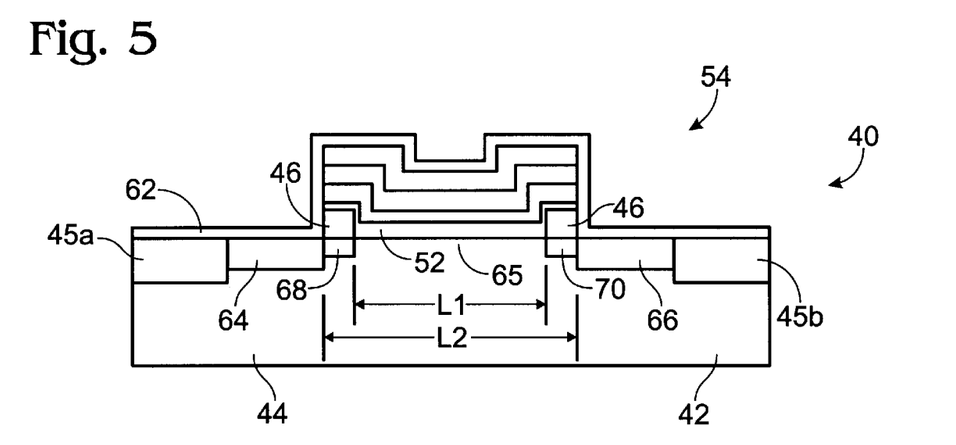

Referring now to FIG. 5, $TiO_2$ or silicon nitride is deposited to a thickness of between 10 nm to 50 nm to form a first insulating layer 62. The structure is implanted with arsenic ions at an energy of between 30 keV to 80 keV and a concentration of $1.0 \times 10^{15}$ $cm^{-2}$ to $1.0 \times 10^{16}$ $cm^{-2}$ to form a n+ source region 64 and a n+ drain region 66. The structure is annealed at a temperature of between 600° C. to 1,000° C. for between about 10 minutes to 60 minutes. During the annealing process, phosphorus diffuses from PSG to the silicon substrate to form lightly doped source region 68 and lightly doped drain region 70, resulting in the structure depicted in FIG. 5.

Figure 6:
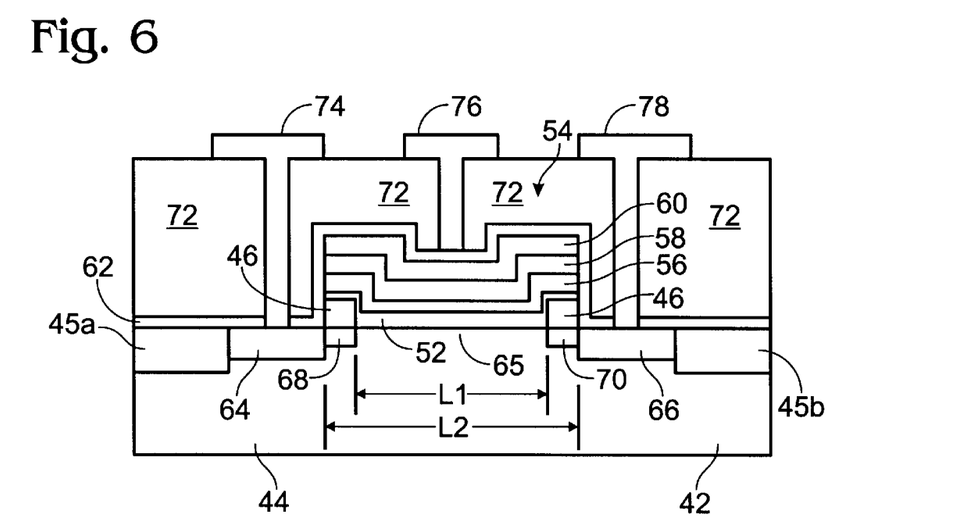
FIG. 6 depicts a completed MFMOS memory transistor constructed according to the invention.

A passivation oxide, or second insulating, layer 72 is deposited by CVD. The structure is coated with photoresist and contact etched to form areas to receive the electrodes for the transistor. The structure is then metallized to form a source electrode 74, a gate electrode 76 and a drain electrode 78, resulting in the competed structure shown in FIG. 6.

Figure 7:
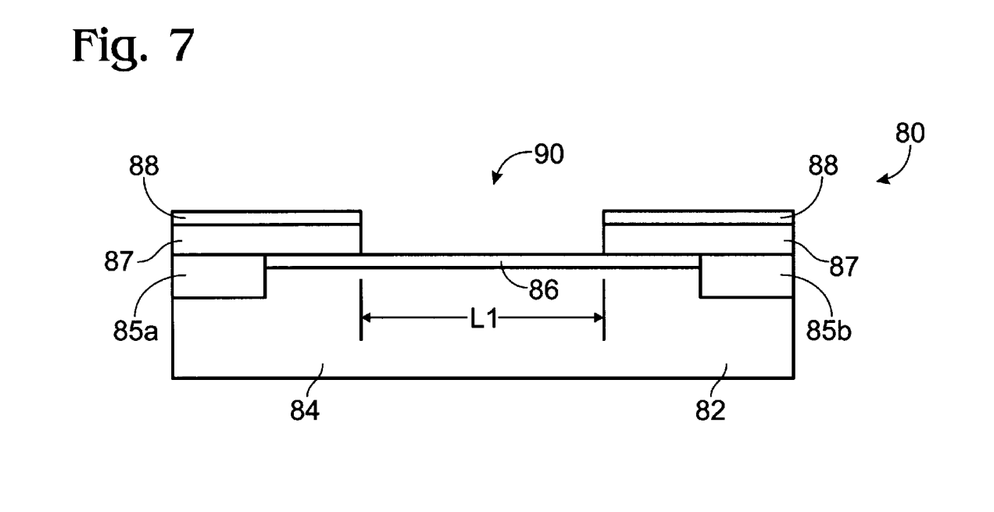
FIGS. 7–9 depict successive steps in the manufacture of a MFMS memory transistor constructed according to the invention.

For MFMS memory transistors the process is similar to that of MFMOS memory transistor. Referring now to FIG. 7, the process from constructing a MFMS memory transistor 80 will be described.

As in the case of MFMOS memory transistor 40, plural devices constructed according to the invention are formed on a silicon wafer, which may either a separation by implantation of oxygen (SIMOX) substrate, or a bulk silicon substrate 82. The first step in the manufacturing process is to form the device areas for plural structures by isolating portions of the wafer from adjoining device areas. This may be done by trenching or by implantation of insulating materials.

The next step is n– well or p– well formation in the device areas. In the example provided herein, a p– well 84 is formed in substrate 82 by implantation of boron ions, preferably at an energy level of 30 keV to 180 keV, and a concentration of $5.0 \times 10^{11}$ $cm^{-2}$ to $5.0 \times 10^{13}$ $cm^{-2}$. Oxide regions 85a, 85b are formed in the substrate to provide further device isolation.

The next step includes implantation of phosphorous ions, preferably at an energy level of 5 keV to 40 keV, and a concentration of $5.0 \times 10^{11}$ $cm^{-2}$ to $1.0 \times 10^{13}$ $cm^{-2}$, to form an n– layer 86 in the top 20 nm to 100 nm of silicon substrate 82. Here, the process differs from that used to form MFMOS memory transistor 40. Another difference in the formation of a MFMS transistor is that the PSG layer may be used, but is not necessary. The description of this embodiment includes the use of the PSG layer, however, its use may be omitted, and may be replaced with oxide only. A phosphorous silicate glass (PSG) layer 87 is deposited to a thickness of between 100 nm to 300 nm, at a temperature of between 300° C. to 500° C. A silicon oxide cap 88, having a thickness of between 20 nm to 50 nm is deposited over the PSG. The combination of the PSG layer and the silicon oxide cap is referred to herein as a FE gate stack surround structure. Alternately, a layer of low-temperature oxide may be deposited by CVD to a thickness of 100 nm to 300 nm in place of the PSG and oxide cap, over n– layer 86, which n– and oxide layers function as the FE gate stack surround structure.

The structure is coated with photoresist, and the oxide at the gate region is plasma etched to form an opening 90 in the FE gate stack surround structure having a width L1. The etching process is stopped before the underlying silicon is removed. The photoresist is then removed, resulting in the structure as shown in FIG. 7.

A layer of low-temperature oxide is deposited by CVD to a thickness of between 10 nm to 40 nm, joining with oxide cap 88. This layer is plasma etched to the level of the silicon substrate. The structure is wet cleaned, and the silicon is etched just enough to remove any silicon damaged during the plasma etch process.

Figure 8:
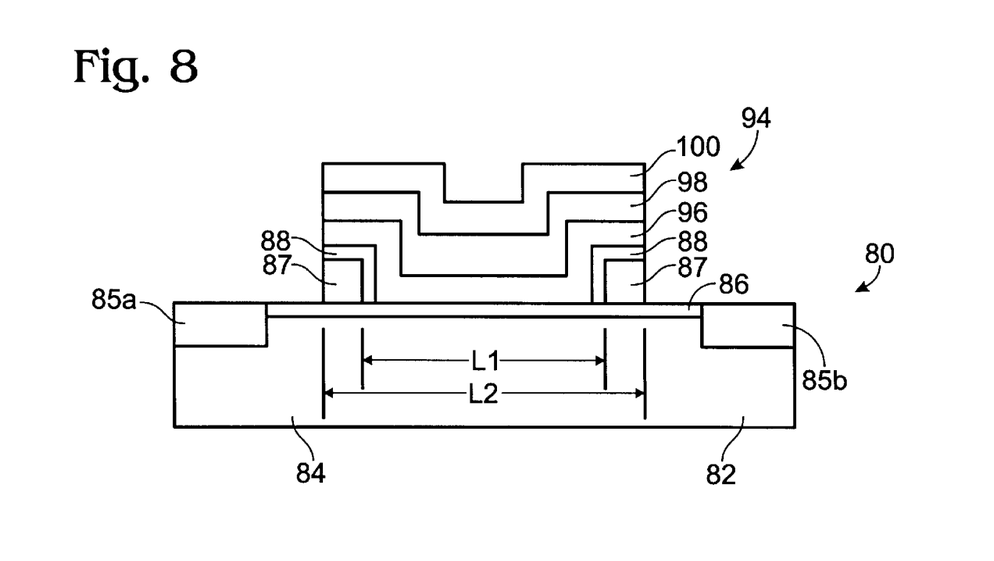

At this point, formation of the ferroelectric gate unit may begin. Referring now to FIG. 8, a FE gate stack is identified generally at 94, and includes a bottom electrode 96, the ferroelectric (FE) material 98 and a top electrode 100. The construction of FE gate stack 94 is the same as previously described.

The structure is coated with photoresist. Ferroelectric gate stack 94, along with underlying oxide 92, is plasma etched, to the level of silicon substrate 82. The width of the ferroelectric stack is L2, where $L2 \geq L1+2\delta$, and $\delta$ is the alignment tolerance of the lithographic process.

Figure 9:
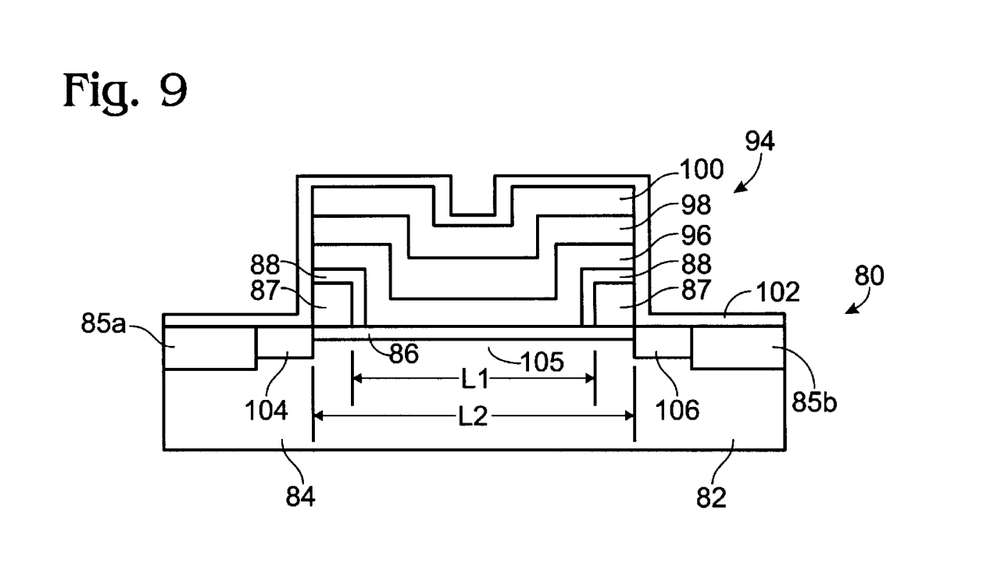

Referring now to FIG. 9, $TiO_2$ or silicon nitride is deposited to a thickness of between 10 nm to 50 nm to form a first insulating layer 102. The structure is implanted with arsenic ions at an energy of between 30 keV to 80 keV and a concentration of $1.0 \times 10^{15}$ $cm^{-2}$ to $1.0 \times 10^{16}$ $cm^{-2}$ to form a n+ source region 104 and a n+ drain region 106. The structure, with a PSG layer, is annealed at a temperature of between 600° C. to 1,000° C., for between 10 minutes and 60 minutes, resulting in the structure depicted in FIG. 9. If the structure is formed without the PSG layer, the structure is annealed at a temperature of between 500° C. to 700° C., for between 20 minutes and 100 minutes.

Figure 10:
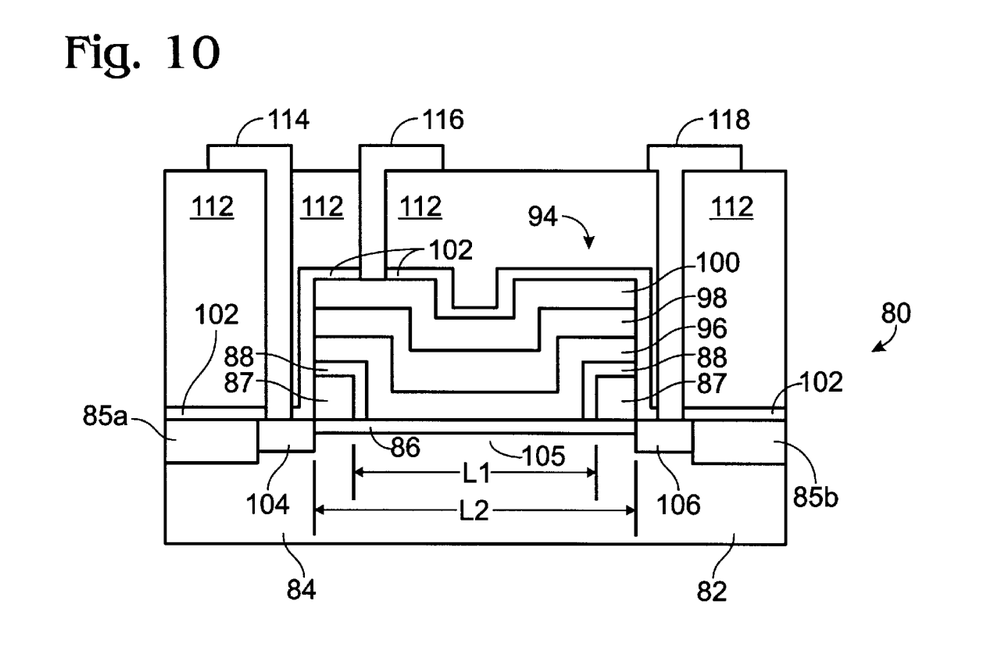
FIG. 10 depicts a completed MFMS memory transistor constructed according to the invention.

A passivation oxide, or second insulating, layer 112 is deposited by CVD. The structure is coated with photoresist and contact etched to form areas to receive the electrodes for the transistor. The structure is then metallized to form a source electrode 114, a gate electrode 116 and a drain electrode 118, resulting in the competed structure shown in FIG. 10.

Although a preferred embodiment of the invention, and a variation thereof, has been disclosed, it should be appreciated that further variations and modifications may be made thereto within the scope of the appended claims.

We claim:

1. A method of fabricating a ferroelectric memory transistor using a lithographic process having an alignment tolerance of δ, comprising:

preparing a silicon substrate for construction of a ferroelectric gate unit;

implanting boron ions to form a p– well in the substrate;

isolating plural device areas on the substrate;

forming a ferroelectric (FE) gate stack surround structure for surrounding a ferroelectric (FE) gate stack which is formed in a subsequent step, the step of forming a FE gate stack surround structure including depositing a PSG layer by CVD at a temperature of between about 300° C. and 500° C. having a thickness of between about 100 nm to 300 nm over the device area; and depositing an oxide layer over the PSG layer to a thickness of between about 20 nm to 50 nm;

etching the FE gate stack surround structure to form an opening having a width of L1 to expose the substrate in a gate region;

depositing, by CVD, oxide to a thickness of between about 10 nm to 40 nm over the exposed substrate;

forming a FE gate stack over the gate region, wherein the FE gate stack has a width of L2, wherein L2≧L1+2δ;

depositing a first insulating layer over the structure;

implanting arsenic ions to form a source region and a drain region; and annealing the structure, including forming a lightly doped source region and a lightly doped drain region in the silicon substrate below the PSG by heating the structure at a temperature of between 600° C. to 1,000° C. for between about 10 minutes and 60 minutes.

2. The method of claim 1 wherein said step of forming a FE gate stack includes depositing a bottom electrode to a thickness of between about 10 nm to 40 nm, depositing the ferroelectric material to a thickness of between about 100 nm to 400 nm, and depositing the top electrode to a thickness of between about 10 nm to 40 nm.

3. The method of claim 2 wherein said depositing the bottom and top electrode includes depositing material taken from the group consisting of Pt, Ir and Pt/Ir alloy.

4. The method of claim 2 wherein said depositing the ferroelectric material includes depositing a FE layer of material taken from the group consisting of Pb(Zr, Ti)O$_3$ (PZT), PLZT, SrBi$_2$Ta$_2$O$_9$ (SBT), Pb$_5$Ge$_3$O$_{11}$, BaTiO$_3$ and LiNbO$_3$.

5. A method of fabricating a ferroelectric memory transistor using a lithographic process having an alignment tolerance of δ, comprising:

preparing a silicon substrate for construction of a ferroelectric gate unit;

implanting boron ions to form a p– well in the substrate;

isolating plural device areas on the substrate;

forming a ferroelectric (FE) gate stack surround structure for surrounding a ferroelectric (FE) gate stack which is formed in a subsequent step, the step of forming a FE gate stack surround structure including depositing a layer of phosphorous silicate glass (PSG) on the substrate; and depositing an oxide layer over the PSG layer;

etching the FE gate stack surround structure to form an opening having a width of L1 to expose the substrate in a gate region;

depositing, by CVD, oxide to a thickness of between about 10 nm to 40 nm over the exposed substrate;

forming a FE gate stack over the gate region, wherein the FE gate stack has a width of L2, wherein L2≧L1+2δ;

depositing a first insulating layer over the structure;

implanting arsenic ions to form a source region and a drain region; and annealing the structure to diffuse phosphorous from the PSG into the silicon substrate to form a lightly doped source region and a lightly doped drain region in the silicon substrate below the PSG, said annealing step including heating the structure at a temperature of between 600° C. to 1,000° C. for between about 10 minutes and 60 minutes.

6. The method of claim 5 wherein said step of forming the FE gate stack surround structure includes implanting phosphorous ions, at an energy level of 5 keV to 40 keV, and a concentration of $5.0 \times 10^{11}$ cm$^{-2}$ to $1.0 \times 10^{13}$ cm$^{-2}$, to form an n– layer in the top 20 nm to 100 nm of the silicon substrate.

7. The method of claim 5 wherein said step of forming the FE gate stack includes depositing a bottom electrode to a thickness of between about 10 nm to 40 nm, depositing ferroelectric material to a thickness of between about 100 nm to 400 nm, and depositing a top electrode to a thickness of between about 10 nm to 40 nm.

8. The method of claim 7 wherein said steps of depositing the bottom and top electrodes include depositing material taken from the group consisting of Pt, Ir and Pt/Ir alloy.

9. The method of claim 7 wherein said step of depositing the ferroelectric material includes depositing a FE layer of material taken from the group consisting of Pb(Zr, Ti)O$_3$ (PZT), PLZT, SrBi$_2$Ta$_2$O$_9$ (SBT), Pb$_5$Ge$_3$O$_{11}$, BaTiO$_3$ and LiNbO$_3$.

10. A method of fabricating a ferroelectric memory transistor using a lithographic process having an alignment tolerance of δ, comprising:

preparing a silicon substrate for construction of a ferroelectric gate unit;

implanting boron ions to form a p– well in the substrate;

isolating plural device areas on the substrate;

forming a ferroelectric (FE) gate stack surround structure for surrounding a ferroelectric (FE) gate stack which is formed in a subsequent step, the step of forming a FE gate stack surround structure including depositing a layer of phosphorous silicate glass (PSG) on the substrate; and depositing an oxide layer over the PSG layer;

etching the FE gate stack surround structure to form an opening having a width of L1 to expose the substrate in a gate region;

depositing, by CVD, oxide to a thickness of between about 10 nm to 40 nm over the exposed substrate;

forming a FE gate stack over the gate region, wherein the FE gate stack has a width of L2, wherein L2≧L1+2δ;

depositing a first insulating layer over the structure;

implanting arsenic ions to form a source region and a drain region; and annealing the structure to diffuse phosphorous from the PSG into the silicon substrate to form a lightly doped source region and a lightly doped drain region in the silicon substrate below the PSG, said annealing step including heating the structure at a temperature of between 500° C. to 700° C. for between about 20 minutes and 100 minutes.

11. The method of claim 10 wherein said step of forming the FE gate stack surround structure includes implanting phosphorous ions, at an energy level of 5 keV to 40 keV, and a concentration of $5.0 \times 10^{11}$ cm$^{-2}$ to $1.0 \times 10^{13}$ cm$^{-2}$, to form an n− layer in the top 20 nm to 100 nm of the silicon substrate.

12. The method of claim 10 wherein said step of forming the FE gate stack includes depositing a bottom electrode to a thickness of between about 10 nm to 40 nm, depositing ferroelectric material to a thickness of between about 100 nm to 400 nm, and depositing a top electrode to a thickness of between about 10 nm to 40 nm.

13. The method of claim 12 wherein said steps of depositing the bottom and top electrodes include depositing material taken from the group consisting of Pt, Ir and Pt/Ir alloy.

14. The method of claim 12 wherein said step of depositing the ferroelectric material includes depositing a FE layer of material taken from the group consisting of Pb(Zr, Ti)O$_3$ (PZT), PLZT, SrBi$_2$Ta$_2$O$_9$ (SBT), Pb$_5$Ge$_3$O$_{11}$, BaTiO$_3$ and LiNbO$_3$.

* * * * *

UNITED STATES PATENT AND TRADEMARK OFFICE
CERTIFICATE OF CORRECTION

PATENT NO : 6,048,740
DATED : 04/11/2000
INVENTOR(S): Sheng Teng Hsu, Jer-shen Maa, Fengyan Zhang and Tingkai Li It is certified that error appears in the above-identified patent and that said Letters Patent are hereby corrected as shown below:

On the title page: Item [75] the spelling of the third inventor's name "Fengyang Zhang"

Should be:

-- Fengyan Zhang --.

Signed and Sealed this

Fifteenth Day of May, 2001

Attest:

NICHOLAS P. GODICI

*Attesting Officer*  *Acting Director of the United States Patent and Trademark Office*